United States Patent
Choi et al.

(10) Patent No.: US 10,896,889 B2
(45) Date of Patent: Jan. 19, 2021

(54) MULTILAYER CLIP STRUCTURE ATTACHED TO A CHIP

(71) Applicant: JMJ Korea Co., Ltd., Bucheon-si (KR)

(72) Inventors: Yun Hwa Choi, Bucheon-si (KR); Young hun Kim, Incheon (KR); Tae Heon Lee, Gwangju (KR); Jeong Hun Cho, Goyang-si (KR)

(73) Assignee: JMJ Korea Co., Ltd., Bucheon-si (KR)

( * ) Notice: Subject to any disclaimer, the term of this patent is extended or adjusted under 35 U.S.C. 154(b) by 0 days.

(21) Appl. No.: 16/572,621

(22) Filed: Sep. 17, 2019

(65) Prior Publication Data
US 2020/0168576 A1     May 28, 2020

(30) Foreign Application Priority Data

Nov. 27, 2018 (KR) .................... 10-2018-0148016

(51) Int. Cl.
*H01L 23/495* (2006.01)
*H01L 21/00* (2006.01)
*H01L 23/00* (2006.01)

(52) U.S. Cl.
CPC .............. *H01L 24/40* (2013.01); *H01L 24/32* (2013.01); *H01L 2924/01013* (2013.01); *H01L 2924/01028* (2013.01); *H01L 2924/01029* (2013.01)

(58) Field of Classification Search
CPC ........... H01L 23/49524; H01L 23/3107; H01L 24/29; H01L 24/40; H01L 24/32; H01L 24/37; H01L 24/84
See application file for complete search history.

(56) References Cited

U.S. PATENT DOCUMENTS

| | | | |
|---|---|---|---|
| 6,034,422 A * | 3/2000 | Horita | H01L 23/49582 257/666 |
| 6,083,772 A * | 7/2000 | Bowman | H01L 23/3121 257/E21.509 |
| 7,972,906 B2 * | 7/2011 | Cruz | H01L 23/49562 438/125 |

(Continued)

FOREIGN PATENT DOCUMENTS

| | | |
|---|---|---|
| JP | 2009-105266 A | 5/2009 |
| KR | 10-1208332 B1 | 12/2012 |

(Continued)

*Primary Examiner* — Alonzo Chambliss
(74) *Attorney, Agent, or Firm* — Park, Kim & Suh, LLC

(57) ABSTRACT

Disclosed is technology in that a clip structure formed of an inexpensive and light metallic material to easily performing soldering on a corresponding metal and to reduce costs of a semiconductor package and to reduce the weight of the semiconductor package. The composite clip structure bent at a predetermined angle and being in charge of electrical connection between components in a semiconductor package includes a main metal layer formed of a conductive material with a predetermined thickness, and a lower functional layer formed below the main metal layer and formed of a different type of metal from a metallic component of the main metal layer, wherein the lower functional layer is attached to the main metal layer to be integrated thereinto, and wherein the main metal layer is formed of a single metal containing a largest amount of aluminum (Al) or a metal mixture containing a largest amount of Al.

13 Claims, 7 Drawing Sheets

(56) References Cited

U.S. PATENT DOCUMENTS

| | | | |
|---|---|---|---|
| 8,669,652 B2 * | 3/2014 | Hata | H01L 23/49513 |
| | | | 257/690 |
| 10,535,589 B2 * | 1/2020 | Choi | H01L 24/72 |
| 2002/0163085 A1 * | 11/2002 | Shimokawa | B23K 35/004 |
| | | | 257/772 |
| 2007/0085201 A1 | 4/2007 | Bauer et al. | |
| 2009/0224383 A1 * | 9/2009 | Cruz | H01L 23/49524 |
| | | | 257/676 |
| 2013/0264696 A1 * | 10/2013 | Kajiwara | H01L 23/49548 |
| | | | 257/676 |
| 2014/0175628 A1 * | 6/2014 | Pan | H01L 23/49524 |
| | | | 257/676 |

FOREIGN PATENT DOCUMENTS

| | | |
|---|---|---|
| KR | 10-1631232 B1 | 6/2016 |
| KR | 10-1669902 B1 | 10/2016 |
| KR | 10-2017-0012927 A | 2/2017 |
| KR | 20-0482370 Y1 | 2/2017 |
| KR | 10-1982555 B1 | 5/2019 |

* cited by examiner

MULTILAYER CLIP STRUCTURE ATTACHED TO A CHIP

CROSS-REFERENCE TO RELATED APPLICATIONS

This application claims priority from Korean Patent Application No. 10-2018-0148016, filed on Nov. 27, 2018, in the Korean Intellectual Property Office, the disclosure of which is incorporated herein by reference in its entirety.

BACKGROUND OF THE INVENTION

Field of the Invention

The present invention relates to a composite clip structure and a semiconductor package using the same, and more particularly, to technology in that a clip structure formed of an inexpensive and light metallic material to easily performing soldering on a corresponding metal and to reduce costs of a semiconductor package and to reduce the weight of the semiconductor package.

Description of the Related Art

In general, a semiconductor package includes a semiconductor chip, a lead frame, and a package body, and the semiconductor chip is attached onto a pad of the lead frame and is electrically connected to a lead of the lead frame via bonding of a metal wire.

However, because a conventional stack package using a metal wire electrically exchanges a signal through a metal wire, a signal exchange speed of the stack package is low, and the electrical properties of each chip are degraded due to use of a large number of wires. An additional area of a substrate is required to form a metal wire to increase the size of the package, and a gap for wire bonding to a bonding pad of each chip is required, and thus, there is a problem in that the entire height of the package is unnecessarily increased.

Accordingly, the cited references disclosed by the present inventor, i.e., Korean Patent No. 1208332, Korean Utility Model No. 0482370, Korean Patent No. 1669902, and Korean Patent No. 1631232 disclose an effective package structure that uses a metallic clip structure to have excellent electrical connection performance, easy heat dissipation, and high thermal stability, compared with a conventional semiconductor package using a metal wire.

However, a conventional clip formed of copper (Cu) has been used due to the advantage of excellent soldering, but there is a problem in that manufacturing costs are increased and weight is high due to material properties. Such a problem is associated with an increase in the manufacturing costs of various electronic products using a semiconductor chip package, and the weight of the clip is a very important factor of a product manufactured via cost investment in weight reduction, such as a smart phone.

SUMMARY OF THE INVENTION

The present invention provides a clip structure formed of an inexpensive and light metallic material compared with a conventional clip formed of copper (Cu) to overcome a problem in that soldering is not enabled using the corresponding metallic material.

According to an aspect of the present invention, a composite clip structure bent at a predetermined angle and being in charge of electrical connection between components in a semiconductor package includes a main metal layer formed of a conductive material with a predetermined thickness, and a lower functional layer formed below the main metal layer and formed of a different type of metal from a metallic component of the main metal layer, wherein the lower functional layer is attached to the main metal layer to be integrated thereinto, and wherein the main metal layer 110 is formed of a single metal containing a largest amount of aluminum (Al) or a metal mixture containing a largest amount of Al.

According to another aspect of the present invention, a semiconductor package includes a lead frame including a pad and a plurality of lead terminals, one or more semiconductor chips installed on the pad, a clip structure for electrically connect the semiconductor chip and the lead terminals to each other, and a package body configured to protect a surrounding of the semiconductor chip via molding, wherein the clip structure is formed in such a way that a main metal layer formed of a conductive material with a predetermined thickness and a lower functional layer formed below the main metal layer and formed of a different type of metal from a metallic component of the main metal layer are integrated into each other, the main metal layer is formed of a single metal containing a largest amount of aluminum (Al) or a metal mixture containing a largest amount of Al, and the lower functional layer is formed of a metallic material for enabling soldering.

BRIEF DESCRIPTION OF THE DRAWING FIGURES

The above and/or other aspects of the present invention will be more apparent by describing certain exemplary embodiments of the present invention with reference to the accompanying drawings, in which.

DETAILED DESCRIPTION OF THE EXEMPLARY EMBODIMENTS

Hereinafter, the present invention will be described in detail by explaining exemplary embodiments of the invention with reference to the attached drawings. In the description of the present invention, certain detailed explanations of related art are omitted when it is deemed that they may unnecessarily obscure the essence of the invention.

Figure 1:
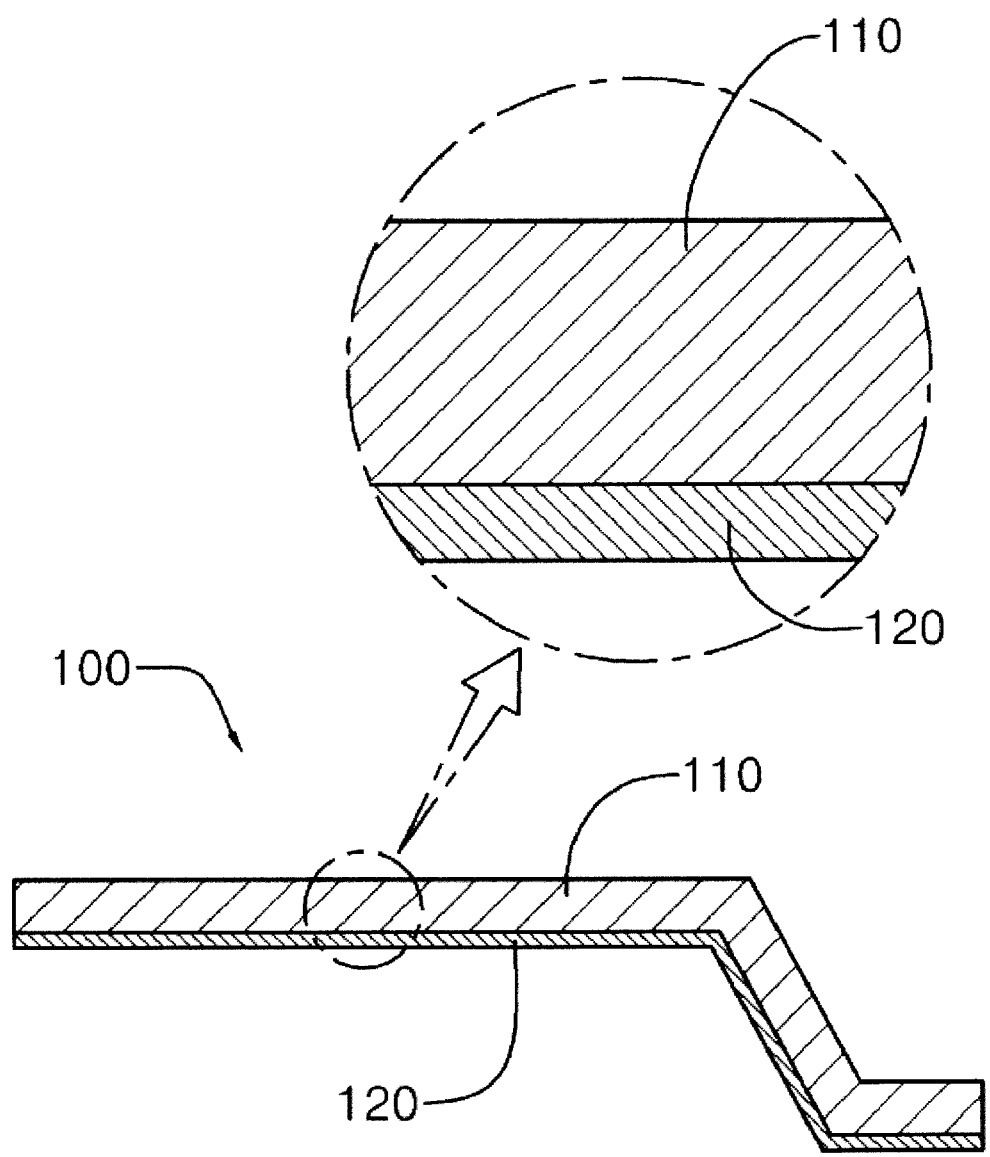
FIG. 1 is a diagram showing a composite clip structure according to the present invention.

A clip structure 100 according to the present invention may be bent at a predetermined angle and may be in charge of electrical connection between components in a semiconductor package, and as shown in FIG. 1, the clip structure 100 may include a main metal layer 110 formed of a conductive material with a predetermined thickness, and a lower functional layer 120 formed below the main metal layer 110 and formed of a different type of metal from a metallic component of the main metal layer 110, in which case the lower functional layer 120 may be attached to the main metal layer 110 to be integrated thereinto, and the main metal layer 110 may be formed of a single metal containing a largest amount of aluminum (Al) or a metal mixture containing a largest amount of Al.

The main metal layer 110 may be formed of a single metal containing a largest amount of aluminum (Al) or a metal mixture containing a largest amount of Al because a material of aluminum (Al) but not copper (Cu) that is generally applied is applied to reduce costs of the clip structure 100 and to reduce the weight of the clip structure 100.

However, the main metal layer 110 formed of an aluminum material has not been even applied thus far because of a problem in terms of difficult soldering and poor quality due to the properties of the material. The problem may be overcome through the lower functional layer 120 according to the present invention.

The main metal layer 110 according to the present invention may be a component that is in overall charge of electrical connection and may be formed of a single metal using aluminum (Al) as a main element (with the largest content) or a metal mixture formed by mixing Al as a main element with manganese (Mg), zinc (Zn), magnesium (Mg), iron (Fe), copper (Cu), nickel (Ni), silicon (Si), chromium (Cr), and titanium (Ti). The content of aluminum of the main metal layer 110 may be a minimum of 70% or greater based on the entire weight ratio of the main metal layer 110 in order to reduce manufacturing costs.

The lower functional layer 120 according to the present invention may be integrated into a lower surface portion of the main metal layer 110 formed of a material on which it is difficult to perform soldering, and thus may enable soldering. The lower functional layer 120 may be formed of copper (Cu) or nickel (Ni).

When the lower functional layer 120 uses copper (Cu) as a main element, the lower functional layer 120 may be formed of a single metal, but the lower functional layer 120 may be formed of a mixture formed by mixing copper (Cu) as a main element with other metals. In this case, a ratio of copper (Cu) may be a weight ratio equal to or greater than 60% based on the entire weight of the lower functional layer 120 and may include at least one of aluminum (Al), silver (Ag), iron (Fe), gold (Au), palladium (Pd), or nickel (Ni).

When the lower functional layer 120 uses nickel (Ni) as a main element, the lower functional layer 120 may be formed of a single metal, but the lower functional layer 120 may be formed of a mixture formed by mixing nickel (Ni) as a main element with other metals. In this case, in the case of nickel (Ni), a ratio of nickel (Ni) may be a weight ratio equal to or greater than 60% based on the entire weight of the lower functional layer 120 and may include at least one of aluminum (Al), silver (Ag), iron (Fe), gold (Au), palladium (Pd), or nickel (Ni), like in the case of copper (Cu).

The lower functional layer 120 may be formed of a single material or may include two layers or more which are formed of different materials.

The lower functional layer 120 may be formed to a thickness of about 0.5 to 100 μm (micrometers), and the main metal layer 110 may be formed to a thickness of about 100 to 500 μm (micrometers) which is greater than the thickness of the lower functional layer 120. The clip structure 100 may be manufactured as a single clip structure 100 by separately manufacturing the lower functional layer 120 and the main metal layer 110 and compressing or plating each other.

Figure 2:
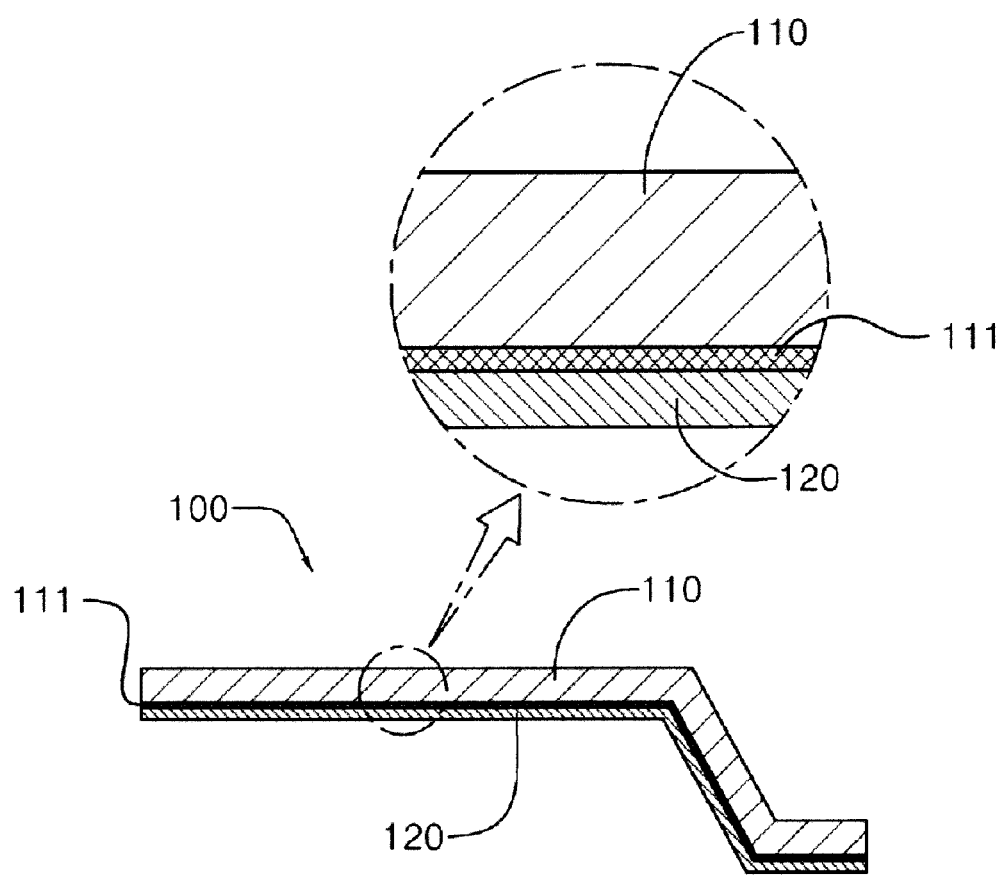
FIG. 2 is a diagram showing an embodiment in which an adhesive layer is formed between a main metal layer and a lower functional layer in a composite clip structure according to the present invention.

When the lower functional layer 120 is formed of copper (Cu) and is formed using a plating method, an adhesive layer 111 may be formed between the lower functional layer 120 and the main metal layer 110 in order to smoothen a plating procedure, as shown in FIG. 2. In this case, the adhesive layer 111 may be formed of nickel (Ni) or titanium (Ti) and may be formed to a thickness of 0.01 to 4 μm (micrometers).

The lower functional layer 120 according to the present invention may be adhered to a semiconductor chip and a lead of a lead frame via a conductive adhesive or solder, and in this regard, when soldering is performed using a conductive solder as an adhesive at a high temperature, a predetermined portion of the lower functional layer 120 may be mixed with the conductive solder to form an intermetallic compound (IMC) layer and to achieve adhesion, thereby configuring an excellent adhesive structure. The lower functional layer 120 configured as such may be formed of copper (Cu) or nickel (Ni) but may be formed of silver (Ag) or palladium (Pd).

Figure 3:
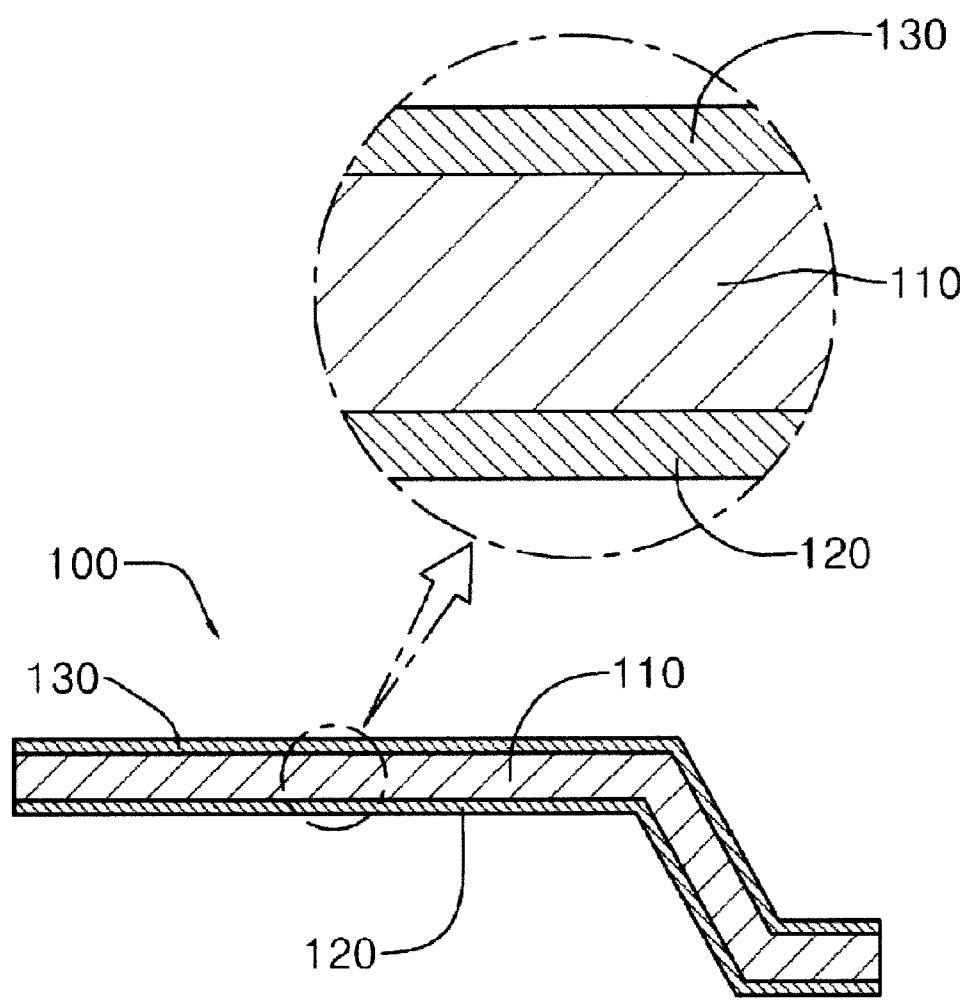
FIG. 3 is a diagram showing an embodiment in which an upper functional layer is further formed above a main metal layer in a composite clip structure according to the present invention.
Figure 4:
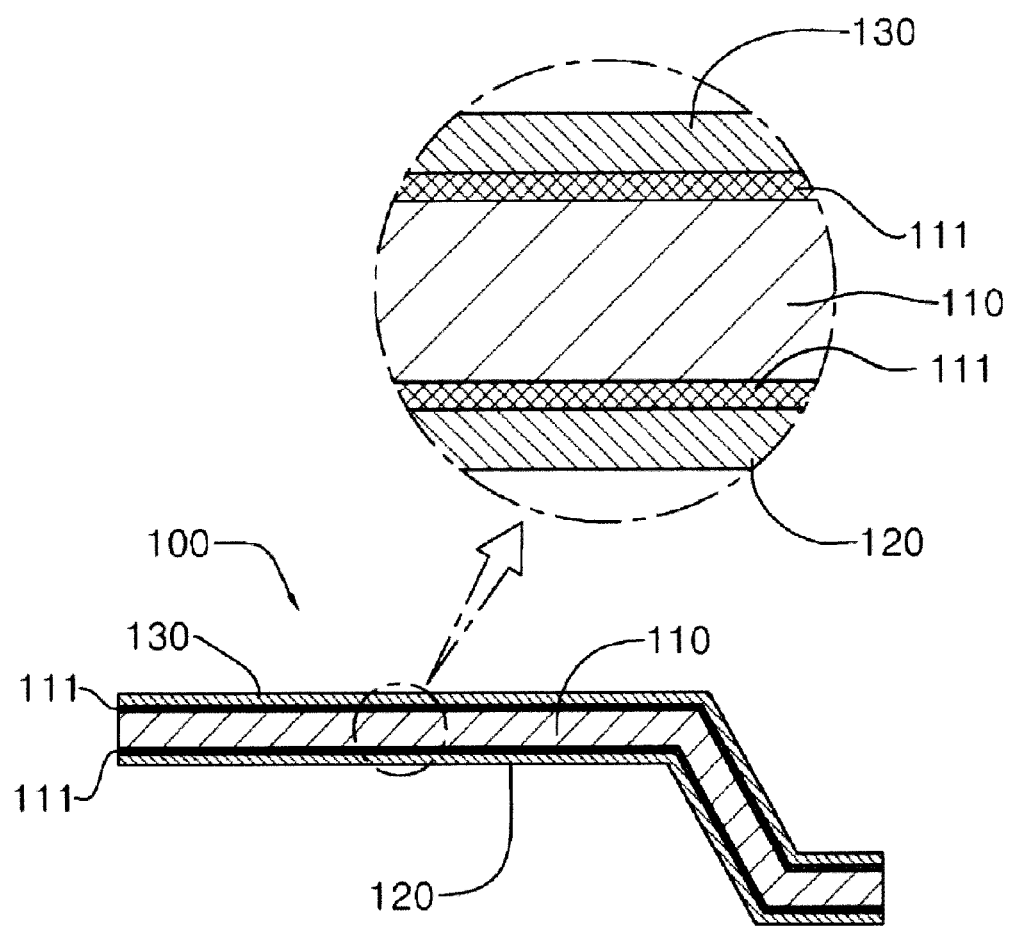
FIG. 4 is a diagram showing an embodiment in which an adhesive layer is further formed between a main metal layer and upper and lower functional layers in a composite clip structure according to the present invention.

In addition, as shown in FIG. 3, an upper functional layer 130, which is formed of a different type of material of the metal component of the main metal layer 110, as well as the lower functional layer 120 may be further formed above the main metal layer 110. The upper functional layer 130 may also be formed of a non-metallic material as well as metal, differently from the lower functional layer 120 that is limited to a metallic material.

The upper functional layer 130 may be formed of a single material of any one of copper (Cu), silver (Ag), aluminum (Al), silicon (Si), nickel (Ni), alumina ($Al_2O_3$), aluminum nitride (AlN), and silica ($SiO_2$) or may also be formed of a mixture formed by mixing one or more materials thereamong.

That is, the upper functional layer may be formed of copper (Cu) or nickel (Ni) to achieve the same effect as that of the lower functional layer and may be formed of a material with high heat conduction to enhance a heat dissipation effect of the clip structure 100 and to facilitate heat dissipation inside a package, or the upper functional layer may be formed of an insulating material to prevent electrical short (short circuits) with other components positioned above the upper functional layer, thereby achieving a condition in which different types of semiconductor chips are stacked.

The upper functional layer 130 may be formed of a single material or may include two layers or more which are formed of different materials.

The composite clip structure configured as such according to the present invention may be implemented according to total of four embodiments as shown in FIGS. 1 to 4 according to whether the upper functional layer 130 is present and the adhesive layer 111 is present.

Figure 5:
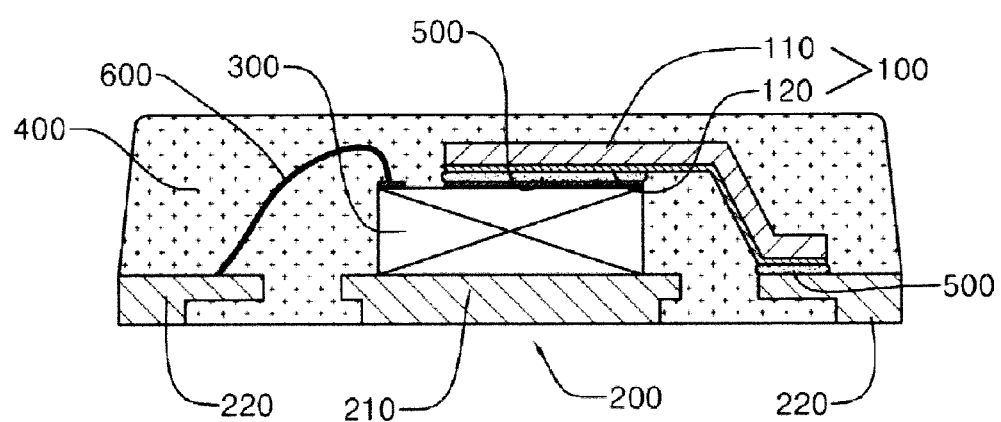
FIG. 5 is a first embodiment of a semiconductor package using a composite clip structure according to the present invention.

FIG. 5 is a diagram showing a semiconductor package using a composite clip structure according to an embodiment of the present invention. The semiconductor package may include a lead frame 200 including a pad 210 and a plurality of lead terminals 220, one or more semiconductor chips 300 installed on the pad 210, the clip structure 100 for electrically connecting the semiconductor chip 300 and the lead terminals 220, and a package body 400 configured to protect a surrounding of the semiconductor chip 300 via molding, in which case the clip structure 100 may be formed in such a way that the main metal layer 110 formed of a conductive material with a predetermined thickness and the lower functional layer 120 formed below the main metal layer 110 and formed of a different type of metal from a metallic component of the main metal layer 110 are integrated into each other, the main metal layer 110 is formed of a single metal containing a largest amount of aluminum (Al) or a metal mixture containing a largest amount of Al, and the lower functional layer 120 is formed of a metallic material for enabling soldering.

Adhesion of the clip structure 100 needs to be achieved through a conductive adhesive 500 such as a solder, and even if the main metal layer 110 formed of aluminum is used, soldering may be enabled due to the lower functional layer 120 according to the present invention.

In addition, the lower functional layer 120 may be adhered to the semiconductor chip 300 and the lead terminals 220 of the lead frame 200 via the conductive adhesive 500 including a solder, and in this regard, when soldering is performed using a conductive solder as an adhesive at a high temperature, a predetermined portion of the lower functional layer 120 may be mixed with the conductive adhesive 500 to form an intermetallic compound (IMC) layer and to achieve adhesion, thereby configuring an excellent adhesive structure.

The lower functional layer 120 may be formed of copper (Cu) or nickel (Ni), a detailed description thereof is the same as the above description of the clip structure 100, and thus a repetition is omitted herein, and the above description may also be given with regard to the upper functional layer 130.

Figure 6:
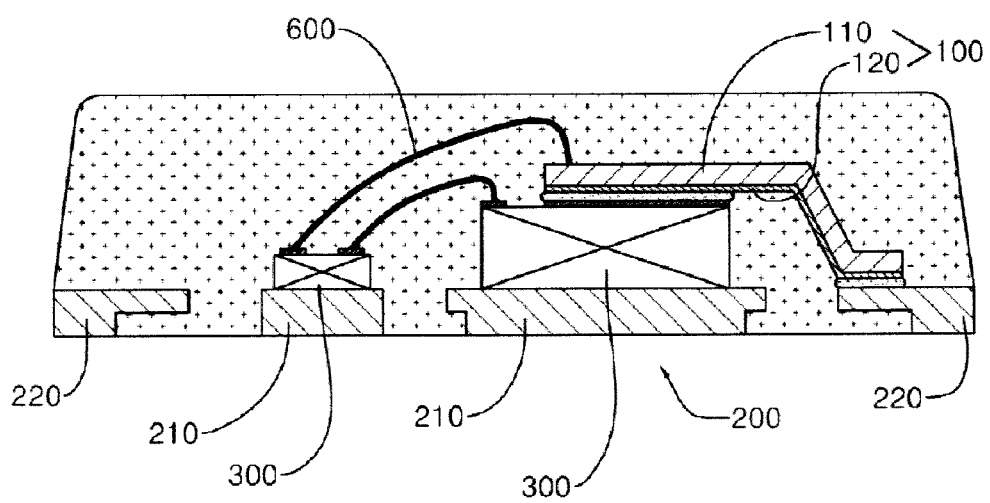
FIG. 6 is a second embodiment of a semiconductor package using a composite clip structure according to the present invention.
Figure 7:
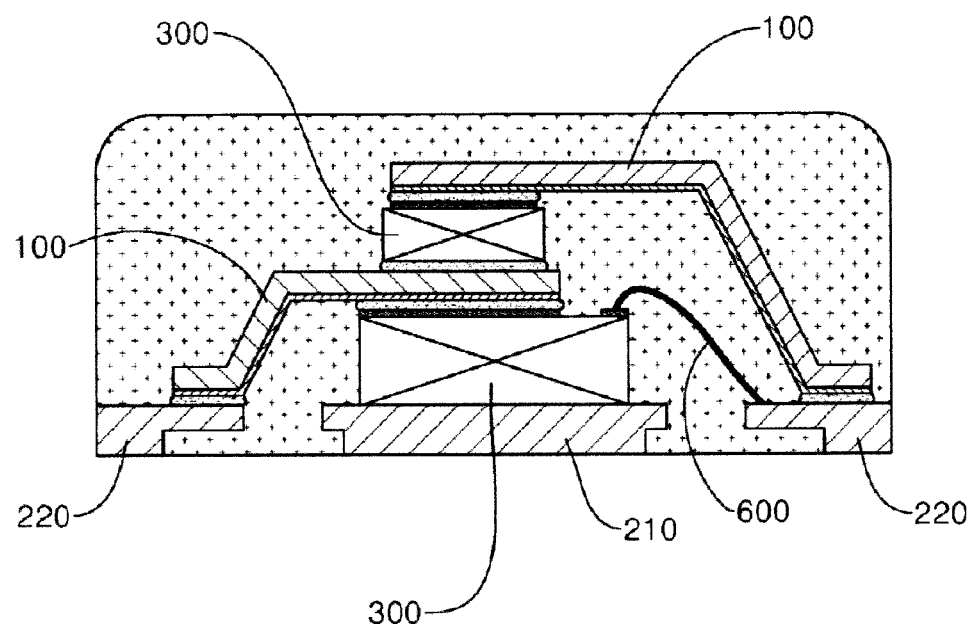
FIG. 7 is a third embodiment of a semiconductor package using a composite clip structure according to the present invention.

FIGS. 6 and 7 are diagrams showing a semiconductor package according to another embodiment of the present invention. FIG. 6 illustrates an embodiment in which the semiconductor chip 300 installed on the pad 210 is divided into an IC chip and a power chip and the IC chip and the power chip are electrically connected to each other by a bonding wire 600. FIG. 7 illustrates an embodiment in which the clip structure 100 and the semiconductor chip 300 are each configured in two or more and are stacked on each other.

There is a problem in that a conventional clip structure is formed of copper (Cu), and thus additional plating with silver (Ag) or gold (Au) needs to be previously performed only on an adhered portion in order to adhere a bonding wire onto the clip structure, but according to the present invention, the main metal layer 110 is formed of aluminum, and thus it may be advantageous that the bonding wire 600 is easily adhered without a separate plating with silver/gold.

According to the present invention, the main metal layer may be formed of aluminum to reduce costs of a clip structure and to reduce the weight of the clip structure compared with a conventional clip formed of copper, and thus it may be advantageous that manufacturing costs of an electronic product are reduced and the weight of the electronic product may be reduced.

In addition, according to the present invention, a conductive adhesive and the lower functional layer may be melted and adhered to each other during a soldering procedure, and thus firm and excellent adhesion may be advantageously achieved compared with simple soldering adhesion.

The foregoing exemplary embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A multilayer clip structure bent at a predetermined angle and being in charge of electrical connection between components in a semiconductor package, a clip structure comprising:
    a main metal layer formed of a conductive material with a predetermined thickness; and
    a lower functional layer formed below the main metal layer and formed of a different type of metal from a metallic component of the main metal layer,
    wherein the lower functional layer is attached to the main metal layer to be integrated thereinto,
    wherein the main metal layer is formed of a single metal containing a largest amount of aluminum (Al) or a metal mixture containing a largest amount of Al,
    wherein the lower functional layer is formed of a metallic material for enabling soldering,
    wherein the lower functional layer is adhered to a semiconductor chip or a lead terminal via a conductive adhesive including a solder, and when soldering is performed, a predetermined portion of the lower functional layer is mixed with the conductive adhesive to form an intermetallic compound (IMC) layer and to achieve adhesion.

2. The multilayer clip structure of claim 1, wherein the aluminum (Al) has content equal to or greater than 70% based on the entire weight ratio of the main metal layer.

3. The multilayer clip structure of claim 1, wherein the lower functional layer is formed of a single metal containing a largest amount of copper (Cu) or a metal mixture containing a largest amount of Cu.

4. The multilayer clip structure of claim 3, wherein the copper (Cu) has content equal to or greater than 60% based on the entire weight ratio of the lower functional layer.

5. The multilayer clip structure of claim 1, wherein the lower functional layer is formed of a single metal containing a largest amount of nickel (Ni) or a metal mixture containing a largest amount of Ni.

6. The multilayer clip structure of claim 5, wherein the nickel (Ni) has content equal to or greater than 60% based on the entire weight ratio of the lower functional layer.

7. The multilayer clip structure of claim 1, further comprising an upper functional layer formed above the main metal layer and formed of a different type of material of the metal component of the main metal layer.

8. The multilayer clip structure of claim 7, wherein the upper functional layer is formed of a mixture including any one, or one or more of copper (Cu), silver (Ag), aluminum (Al), silicon (Si), nickel (Ni), alumina ($Al_2O_3$), aluminum nitride (AlN), and silica ($SiO_2$).

9. A semiconductor package comprising:
    a lead frame including a pad and a lead terminal;
    a semiconductor chip installed on the pad;
    a clip structure for electrically connecting the semiconductor chip and the lead terminal to each other; and
    a package body configured to protect a surrounding of the semiconductor chip via molding,
    wherein the clip structure is formed in such a way that a main metal layer formed of a conductive material with a predetermined thickness and a lower functional layer formed below the main metal layer and formed of a different type of metal from a metallic component of the main metal layer are integrated into each other, the main metal layer is formed of a single metal containing a largest amount of aluminum (Al) or a metal mixture containing a largest amount of Al, and the lower functional layer is formed of a metallic material for enabling soldering, wherein the lower functional layer is adhered to the semiconductor chip or the lead terminal via a conductive adhesive including a solder, and when soldering is performed, a predetermined portion of the lower functional layer is mixed with the conductive adhesive to form an intermetallic compound (IMC) layer and to achieve adhesion.

10. A semiconductor package of claim 9, wherein the lower functional layer is formed of a single metal containing a largest amount of copper (Cu) or a metal mixture containing a largest amount of Cu.

11. A semiconductor package of claim 9, wherein the lower functional layer is formed of a single metal containing a largest amount of nickel (Ni) or a metal mixture containing a largest amount of Ni.

12. The semiconductor package of claim 9, further comprising an upper functional layer formed above the main metal layer of the clip structure and formed of a different type of material of the metal component of the main metal layer.

13. The semiconductor package of claim 12, wherein the upper functional layer is formed of a mixture including any one, or one or more of copper (Cu), silver (Ag), aluminum (Al), silicon (Si), nickel (Ni), alumina ($Al_2O_3$), aluminum nitride (AlN), and silica ($SiO_2$).

* * * * *